United States Patent
Tjandra et al.

(10) Patent No.: US 8,435,906 B2
(45) Date of Patent: May 7, 2013

(54) METHODS FOR FORMING CONFORMAL OXIDE LAYERS ON SEMICONDUCTOR DEVICES

(75) Inventors: Agus S. Tjandra, San Jose, CA (US); Christopher S. Olsen, Fremont, CA (US); Johanes F. Swenberg, Los Gatos, CA (US); Yoshitaka Yokota, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 12/691,969

(22) Filed: Jan. 22, 2010

(65) Prior Publication Data

US 2010/0216317 A1 Aug. 26, 2010

Related U.S. Application Data

(60) Provisional application No. 61/147,908, filed on Jan. 28, 2009.

(51) Int. Cl.
*H01L 21/31* (2006.01)
(52) U.S. Cl.
USPC ........... 438/770; 438/771; 438/788; 438/787; 257/E21.282; 257/E21.283
(58) Field of Classification Search .......... 438/770, 438/771, 788, 787; 257/E21.282, E21.283
See application file for complete search history.

(56) References Cited

U.S. PATENT DOCUMENTS

| | | | |
|---|---|---|---|
| 6,023,405 A | 2/2000 | Shamouilian et al. |
| 6,450,116 B1 | 9/2002 | Noble et al. |
| 7,141,514 B2 | 11/2006 | Chua |
| 7,292,428 B2 | 11/2007 | Hanawa et al. |
| 2003/0062333 A1 | 4/2003 | Kranz et al. |
| 2004/0016405 A1 | 1/2004 | Mays et al. |
| 2006/0063337 A1 | 3/2006 | Kim |
| 2006/0089006 A1 | 4/2006 | Katoda |
| 2006/0223315 A1 | 10/2006 | Yokota et al. |
| 2007/0173069 A1 | 7/2007 | Kim |
| 2009/0035952 A1 | 2/2009 | Chua et al. |

FOREIGN PATENT DOCUMENTS

| | | |
|---|---|---|
| CN | 1750238 | 3/2006 |
| CN | 1779912 | 5/2006 |
| CN | 101005022 | 7/2007 |
| JP | 2002-359283 | 12/2002 |
| KR | 2005/0120965 | 12/2005 |
| KR | 20050120965 | 12/2005 |

OTHER PUBLICATIONS

English Translation of Korean Patent Publication 1020050120965.*

(Continued)

*Primary Examiner* — Julio J Maldonado
*Assistant Examiner* — Amar Movva
(74) *Attorney, Agent, or Firm* — Servilla Whitney LLC

(57) ABSTRACT

Methods and apparatus for forming an oxide layer on a semiconductor substrate are disclosed. In one or more embodiments, plasma oxidation is used to form a conformal oxide layer by controlling the temperature of the semiconductor substrate at below about 100° C. Methods for controlling the temperature of the semiconductor substrate according to one or more embodiments include utilizing an electrostatic chuck and a coolant and gas convection.

15 Claims, 6 Drawing Sheets

OTHER PUBLICATIONS

Lim, Kwan-Yong et al., "High Reliable and Scalable Tungsten Polymetal Gate Process for Memory Devices Using Low-Temperature Plasma Selective Gate Reoxidation", *Symposium on VLSI Technology Digest of Technical Papers*, (2006), 2 pgs.

International Search Report and Written Opinion, PCT/US2010/022353 Aug. 26, 2010, 8 pgs.

* cited by examiner

METHODS FOR FORMING CONFORMAL OXIDE LAYERS ON SEMICONDUCTOR DEVICES

CROSS-REFERENCE TO RELATED APPLICATION

This application claims priority to U.S. Provisional Application No. 61/147,908, filed Jan. 28, 2009, which is hereby incorporated by reference in its entirety.

BACKGROUND OF THE INVENTION

1. Field of the Invention

Embodiments of the present invention generally relate to semiconductor fabrication, and more particularly, to oxidation of a semiconductor device or its components to form conformal oxide layers.

2. Description of the Related Art

Semiconductor devices require thin oxide layers to be formed at various stages of their fabrication. For example, in transistors, a thin gate oxide layer may be formed as part of a gate stack structure, including sidewalls, as will be described further below. In addition, in some applications, such as in the fabrication of a flash memory film stack, a thin oxide layer may be formed surrounding the entire gate stack, for example, via exposing the stack to an oxidation process. Such oxidation processes have conventionally been performed either thermally or using a plasma.

Thermal processes for forming oxide layers, for example, the gate oxide layer or the gate stack oxidation layer, have worked relatively well in fabrication of semiconductor devices of the larger feature sizes used in the past. Unfortunately, as feature sizes are becoming much smaller and different oxides are employed in the next generation of advanced technologies, the high wafer or substrate temperatures required in thermal oxidation processes are problematic in that the dopants in the silicon wafer (well doped and junctions) diffuse at the higher temperatures (e.g., above about 700° C.). Such a distortion of the dopant profiles and other features can lead to poor device performance or failure.

Plasma processes used to form oxide layers have similar problems. For example, at high chamber pressure (e.g., 100 mTorr), contaminants tend to accumulate in the gate oxide layer during formation, leading to fatal defects in the gate oxide structure such as dangling bonds or mobile charge, and at low chamber pressure (e.g., tens of mTorr), increased plasma ion energy leads to ion bombardment damage and other diffusion problems. For example, conventional oxidation processes often result in a defect known as a bird's beak. Bird's beak refers to diffusion of the oxide layer into the layers of the film stack structure from the sides at the interface between adjacent layers, rounding off the corners of the adjacent layers. The resultant defect has a profile that resembles a bird's beak. The intrusion of the oxide layer into the active region of the memory cell (e.g., in flash memory applications) reduces the active width of the memory cell, thereby undesirably reducing the effective width of the cell and degrading the performance of the flash memory device.

Another limitation of current low temperature plasma processes is that oxidation appears to occur preferentially on surfaces parallel to the wafer or substrate plane, namely, the top and bottom of structures such as gates formed by stacked layers of materials and trenches formed between the gates. It is believed that this is due to the flux of oxygen ions and radicals perpendicular to the wafer. Regardless of the cause, limited oxidation occurs on the sidewalls of the stacks, resulting in an unacceptably thin sidewall layer on the gate stacks and poor conformality. Thus, there is a need for an improved method for forming oxide layers on semiconductor substrates.

SUMMARY

One aspect of the present invention relates to a method of treating an oxide layer formed on a semiconductor substrate. According to one or more embodiments, the method includes placing such a substrate in a plasma reaction chamber on a substrate support. The chamber utilized in one or more embodiments includes an ion generation region. The method may also include introducing or flowing a process gas into the chamber where, in the ion generation region, a plasma is generated in the ion generation region of the chamber and is used to form an oxide layer on the substrate. The plasma formed according to one or embodiments may include oxygen or an oxygen species. In one or more embodiments, the oxide layer is formed from the plasma while the substrate is actively cooled. In such embodiments, actively cooling the substrate increases the sticking coefficient of the oxygen species included in some plasmas.

According to one or more embodiments, the substrate is cooled to a temperature below about 100° C. In a specific embodiment, the substrate is cooled to a temperature in the range of about −50° C. to about 100° C. In a more specific embodiment, the substrate is cooled to a temperature in the range of about −25° C. to 75° C., and in an even more specific embodiment, the substrate is cooled to a temperature in the range of about 0° C. to 50° C.

As used herein, the term "actively cooling" refers to flowing a cooling fluid adjacent to the substrate. In one embodiment, an electrostatic chuck (ESC) is used to flow a cooling fluid adjacent to the substrate. In an alternative embodiment, a convective gas is supplied to the chamber and flowed adjacent to the substrate.

According to one or more embodiments, the substrate is actively cooled by flowing a coolant through the substrate support. In a specific embodiment, the coolant is circulated between the substrate and substrate support. The substrate may also be cooled, for example, through contact with the surface of the substrate, which, in a specific embodiment, includes a plurality of cooling conduits. In a more specific embodiment, the substrate support utilizes a series of channels to supply a coolant to the cooling conduits. Suitable coolants used in such embodiments include helium, other noble gases and combinations thereof.

One or more alternative embodiments actively cool the substrate by flowing a convective gas into the reaction chamber. In a specific embodiment, a helium gas is flowed into the reaction chamber to actively cool the substrate. In a more specific embodiment, convective gas is flowed into the reaction chamber at a flow rate in the range from about 500 sccm to about 3000 sccm. The convective gas used in one or more embodiments includes helium and may also include one or more other noble gases.

The foregoing has outlined rather broadly certain features of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide methods for forming conformal oxide layers by oxidation of semiconductor substrates. Specific embodiments described below are described with reference to oxide layers formed by low temperature oxidation.

As used herein, low temperature oxidation refers to oxidation at temperatures below about 700° C. Conventional plasma oxidation occurs at temperatures above 100° C. due to plasma power transferred to the substrate. At temperatures above 100° C., oxygen ion flux dominates the oxidation process and thus, only half of the oxidation flux arrives at vertical sidewalls, compared the oxidation flux that arrives on horizontal walls (which may also be referred to as top and bottom surfaces or gates and trenches) of structures having a width of 50 nm. Accordingly, where conformality is defined as the ratio of the growth on a sidewall and the growth on a top or bottom surface, conventional plasma oxidation achieves only a 50% conformality at thicknesses greater than 25 Å.

It has been found that active cooling of the substrate to temperatures in the range of about −50° C. to 100° C., for example in a specific range of about −25° C. to 75° C., and more specifically in the range of about 0° C. to 50° C. during plasma oxidation improves the conformality of films formed by the low temperature oxidation of silicon structures. More specifically, film conformality of smaller features less than about 100 nm in thickness are significantly improved. Conformality is defined as the ratio between the thickness of the film formed on the sidewall of a structure to the thickness of the film formed on a horizontal surface of a structure, including the top and bottom surfaces. According to one or more embodiments of the invention, conformality of at least about 75% is achieved, and more particularly of at least about 80%, and in specific embodiments at least about 90%. In one or more embodiments, by processing in the manner described above, the lower temperature is believed to increase the sticking coefficient of the oxygen species to the sidewall of a structure.

Figure 1:
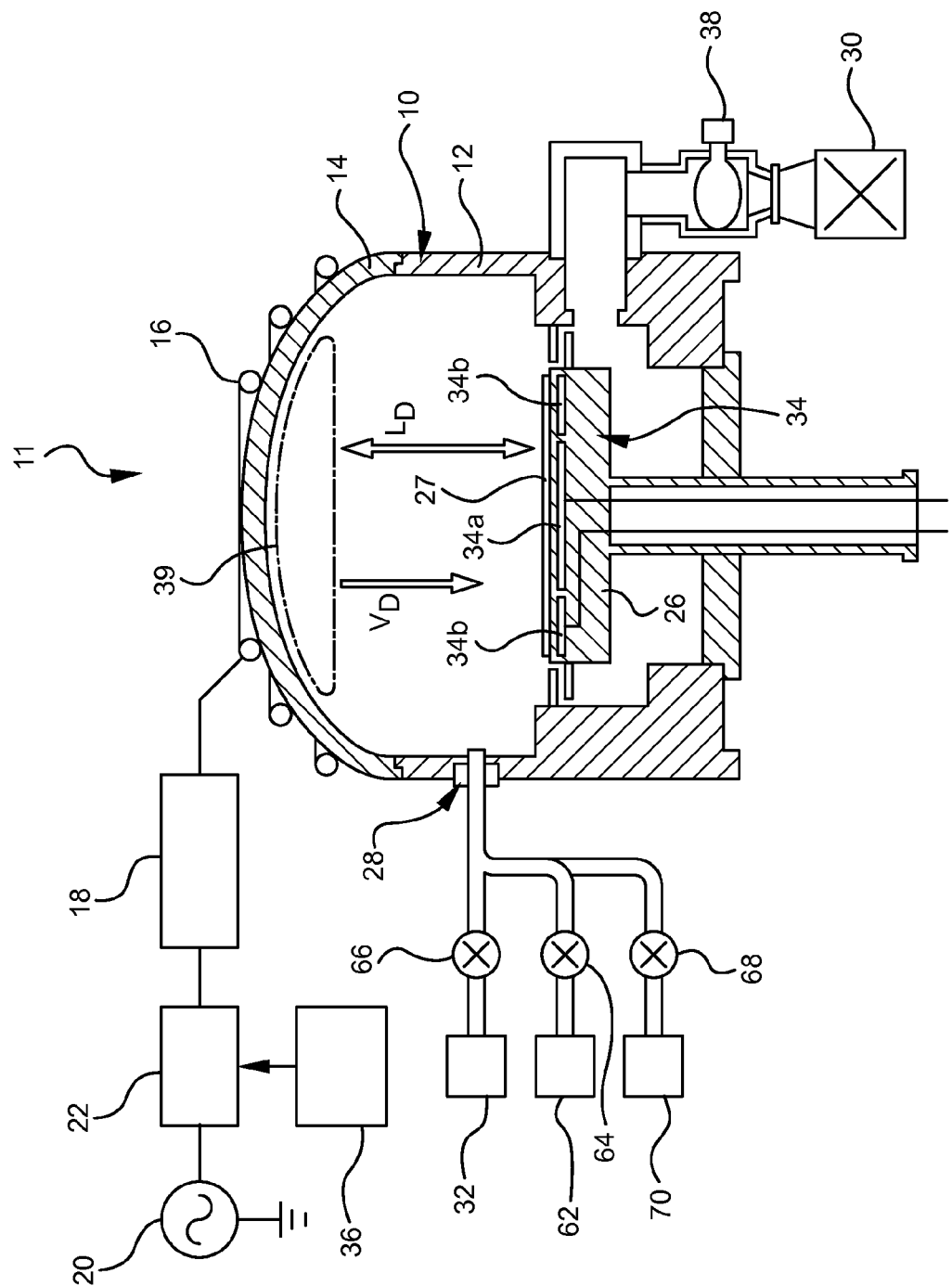
FIG. 1 illustrates a plasma reactor according to an embodiment of the invention.

Embodiments of the present invention may be carried out in suitably equipped plasma reactors, such as Decoupled Plasma Nitridation (DPN) reactors available from Applied Materials, Inc., of Santa Clara, Calif. Other suitable plasma reactors may also be utilized, including, but not limited to a radial line slot antenna plasma apparatus and a hollow cathode plasma apparatus. FIG. 1 depicts an illustrative plasma reactor suitable for carrying out oxide formation processes in accordance with embodiments of the present invention. The reactor may provide a low ion energy plasma and a high ion energy plasma via inductively coupled plasma source power applicators driven by continuous wave (CW) power generators.

The reactor 11 shown in FIG. 1 includes a chamber 10 having a cylindrical side wall 12 and a ceiling 14 which may be either dome-shaped (as shown in the drawing), flat, or another geometry. A plasma source power applicator comprises a coil antenna 16 disposed over the ceiling 14 and coupled through a first impedance match network 18 to a power source. The source comprises an RF power generator 20 and a gate 22 at the output of the generator 20.

The reactor also includes a substrate support pedestal 26, which may be an electrostatic chuck or other suitable substrate support, for holding a semiconductor substrate 27 such as a 200 mm or 300 mm semiconductor wafer or the like. Typically, there is a heating apparatus such as a heater 34 beneath the top surface of the substrate support pedestal 26. The heater 34 may be a single or multiple zone heater, such as a dual radial zone heater having radial inner and outer heating elements 34a and 34b, as depicted in FIG. 1.

In addition, the reactor includes a gas injection system 28 and a vacuum pump 30 coupled to the interior of the chamber 10. The gas injection system 28 is supplied by a gas source, which may include an oxygen container 32, a hydrogen container 62 or a noble gas container 70. Other process gas sources may be included, such as a water vapor source and an inert gas source (not shown). In one or more embodiments, more than one gas source can be utilized. Flow control valves 66, 64 and 68 are coupled to the oxygen container 32, the hydrogen container 62 and the noble gas container 70, respectively, and may be utilized to selectively provide process gases or process gas mixtures to the interior of the chamber 10 during processing. Other gas sources (not shown) for providing additional gases such as nitrogen, gaseous mixtures, or the like may also be provided. The pressure inside the chamber 10 may be controlled by a throttle valve 38 of the vacuum pump 30.

The duty cycle of the pulsed RF power output at the gate 22 may be controlled by controlling the duty cycle of a pulse generator 36 whose output is coupled to the gate 22. Plasma is generated in an ion generation region 39 corresponding to a volume under the ceiling 14 surrounded by the coil antenna 16. As the plasma is formed in an upper region of the chamber 10 at a distance from the substrate 27, the plasma is referred to as a quasi-remote plasma (e.g., the plasma has benefits of remote plasma formation, but is formed within the same chamber 10 as the substrate 27.)

In operation, the plasma reactor may be employed to carry out oxidation processes in accordance with embodiments of the present invention to deposit high quality oxide layers having increased oxide layers on sidewalls of oxide stacks formed on a substrate.

Figure 2A:
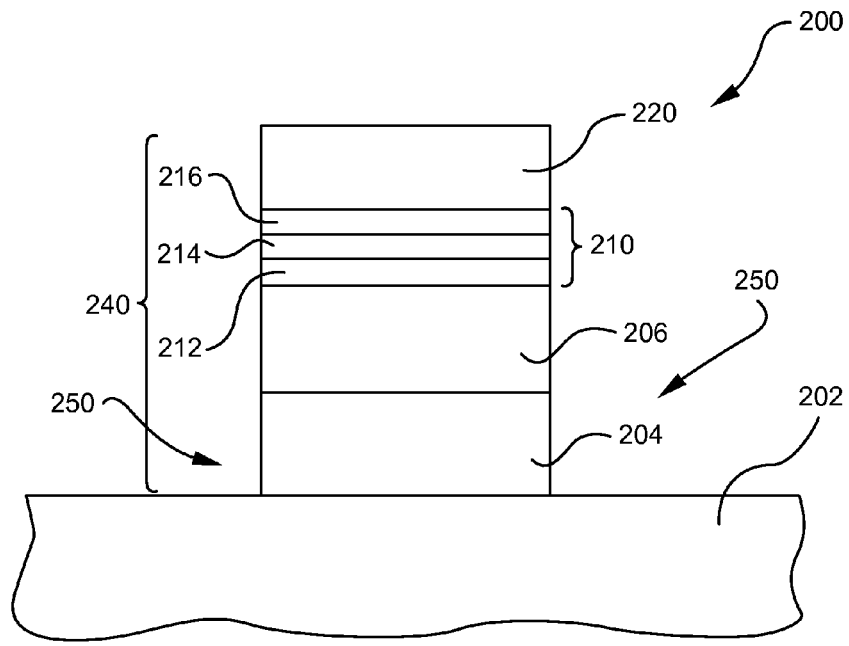
FIG. 2A-B illustrates stages of fabrication of a semiconductor structure in accordance with one or more embodiments of the present invention.
Figure 2B:
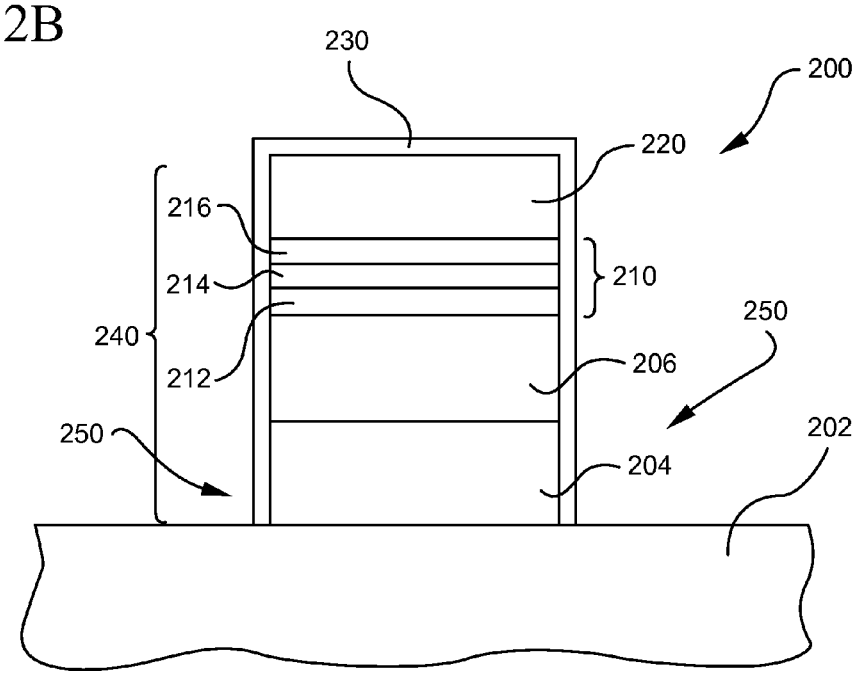

For example, FIGS. 2A-B depict stages of fabrication of a semiconductor structure 200 including a film stack 240 formed over a semiconductor substrate 202. In one or more embodiments, the substrate 202 may include multiple film stacks 240 forming trenches 250 between the stacks. The process described herein for fabrication of the semiconductor structure 200 may be performed, for example, in the reactor 11 described above with respect to FIG. 1.

Substrate 202 has a film stack 240 disposed thereon. The film stack 240 is to be oxidized. The substrate 202 generally corresponds to the substrate 27 of FIG. 1 and is generally supported on the substrate support 26 in the chamber 10 of the plasma reactor 11. The substrate 202 may have various dimensions, such as 200 mm or 300 mm diameter wafers, as well as rectangular or square panels. In some embodiments, the film stack 240 may be formed upon the substrate 202 and then provided to the chamber 10 for the oxidation process. For example, the film stack 240 may be fabricated in one or more process chambers coupled to a cluster tool that also has the plasma reactor 11 coupled thereto. One example of a suitable cluster tool is a Gate Stack CENTURA®, available from Applied Materials, Inc., of Santa Clara, Calif.

The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

It will be understood that the film stack 240 is not limited to the particular materials described above. Thus, the film stack 240 may be any stack of materials to be oxidized. For example, in some embodiments, such as in flash memory applications, the stack 200 may be a gate stack of a flash memory cell comprising a tunnel oxide layer 204, a floating gate layer 206, a single or multi-layer dielectric layer comprising the Interpoly Dielectric (IPD) 210 (a non-limiting example of the IPD is a multi-layer ONO layer comprising an oxide layer 212, a nitride layer 214, and an oxide layer 216 is illustratively shown in FIGS. 2A-B), and a control gate layer 220. The oxide layers 204, 212, 216 typically comprise silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer comprising $SiO_2/Al_2O_3/SiO_2$ can also be used as the IPD layer 210. The floating gate layer 206 and the control gate layer 220 typically comprises a conductive material, such as polysilicon, metals, or the like. It is contemplated that film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch. In some embodiments, the process gas may include water vapor, and in one or more specific embodiments, the water vapor may be mixed with at least one of hydrogen and/or oxygen gas. Alternatively or in combination, the water vapor may be mixed with at least one inert gas, such as helium (He), argon (Ar), krypton (Kr), neon (Ne), or the like.

In some embodiments, the process gas (or gas mixture) may be provided at total flow rate of between about 100-2000 sccm, or at about 400 sccm. For example, in embodiments where both oxygen ($O_2$) and hydrogen ($H_2$) are provided, the oxygen ($O_2$) and hydrogen ($H_2$) may be provided in a total flow rate of between about 100-2000 sccm, or at about 400 sccm, in the percentage ranges described above. In embodiments where water vapor is provided, the water vapor may be introduced at a flow rate of between about 5-1000 sccm with one or more inert carrier gases such as helium, argon, krypton, neon or other suitable inert gases. The inert gases may be provided as necessary to provide a total flow rate of between about 100-2000 sccm and to provide a process gas mixture having up to about 50 percent water vapor. Inert gas additions may also be used with the $H_2/O_2$ mixture to prevent recombination of the ionized oxygen and/or hydrogen. Excited diatomic molecules typically like to recombine with themselves in a plasma, so the addition of inert gases (such as Ar, He, Kr, Ne, or the like) may facilitate higher oxidation rates.

A plasma is generated from the process gases within the chamber 10 to form an oxide layer 230 over the film stack 240. The plasma is formed in the ion generation region 39 of the chamber 10 of FIG. 1 via inductive coupling of RF energy from the coil antenna 16 disposed over the ceiling 14, thereby advantageously providing a low ion energy (e.g., less than about 5 eV for pulsed plasmas and less than 15 eV for CW plasmas). The low ion energy of the plasma limits ion bombardment damage and facilitates oxidation of the sidewalls of the film stack 240 while limiting diffusion of oxygen between the layers thereof, thereby reducing bird's beak.

In some embodiments, about 25 to 5000 watts of power may be provided to the coil antenna 16 at a suitable frequency to form a plasma (for example, in the MHz or GHz range, or about 13.56 MHz or greater). The power may be provided in a continuous wave or pulsed mode. In one or more embodiments, the power is provided in a pulsed mode with duty may of between about 2 to 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 39 loosely corresponding to the volume enclosed by the coil antenna 16. The ion generation region 39 is elevated a significant distance $L_D$ above the substrate 27. Plasma generated in the ion generation region 39 near the ceiling 14 during the "on" time drifts at an average velocity $V_D$ toward the substrate 27 during the "off" time. During each "off" time, the fastest electrons diffuse to the chamber walls, allowing the plasma to cool. The most energetic electrons diffuse to the chamber walls at a much faster velocity than the plasma ion drift velocity $V_D$. Therefore, during the "off" time, the plasma ion energy decreases significantly before the ions reach the substrate 27. During the next "on" time, more plasma is produced in the ion generation region 39, and the entire cycle repeats itself. As a result, the energy of the plasma ions reaching the substrate 27 is significantly reduced. At the lower range of chamber pressure, namely around 10 mT and below, the plasma energy of the pulsed RF case is greatly reduced from that of the continuous RF case.

The "off" time of the pulsed RF power waveform and the distance $L_D$ between the ion generation region 39 and the substrate 27 should both be sufficient to allow plasma generated in the ion generation region 39 to lose a sufficient amount of its energy so that it causes little or no ion bombardment damage or defects upon reaching the substrate 27. Specifically, the "off" time is defined by a pulse frequency between about 2 and 20 kHz, or at about 10 kHz, and an "on" duty cycle between about 5% and 20%. Thus, in some embodiments, the "on" interval may last for a duration in the range of about 5 microseconds to about 50 microseconds, or about 20 microseconds and the "off" interval may last between for a duration in the range of about 50 microseconds to about 95 microseconds, or about 80 microseconds.

In some embodiments, the ion generation region-to-substrate distance $L_D$ is greater than about 2 cm, or in the range of about 2 cm to about 20 cm. The ion generation region-to-substrate distance $L_D$ can be about the same as (or greater than) the distance $V_D$ times the "off" time traveled by the plasma ions during a single "off" time of the pulsed RF power waveform.

In both the continuous wave and the pulsed mode, the plasma advantageously balances the cogeneration of oxygen and hydrogen ions within the chamber and close enough to the substrate to limit the loss of reactivity of the ions with control of the ion energy to prevent ion bombardment induced damage or diffusion damage (e.g., bird's beak).

The plasma generated may be formed in a low pressure process, thereby reducing the likelihood of contamination induced defects. For example, in some embodiments, the chamber 10 may be maintained at a pressure of between about 1-500 mTorr. Moreover, ion bombardment-induced defects that would be expected at such a low chamber pressure levels may be limited or prevented by using the quasi-remote plasma source and, optionally, by pulsing the plasma source power as described above.

According to one or more embodiments, the oxide layer 230 may be formed to a thickness in the range from about 5 Angstroms to about 50 Angstroms. The process may provide growth rates of oxide films in the range of about 7 Angstroms to about 50 Angstroms per minute, or at least about 25 Angstroms per minute. The inventive process disclosed herein provides the oxide growth rate enhancement described above at a lower thermal budget, thereby further limiting diffusion effects by reducing the exposure time of the substrate to the process as compared to conventional oxidation processes. In some embodiments, the process may have a duration in the range from about 5 seconds to about 300 seconds.

The oxide layer 310 can be formed to a desired thickness over the film stack 200. The substrate 202 may be subsequently further processed as necessary to complete the structures being fabricated thereon.

As noted above, it has been found that active cooling of the substrate to temperatures in the range of about −50° C. to 100° C., for example in a specific range of about −25° C. to 75° C., and more specifically in the range of about 0° C. to 50° C. during plasma oxidation improves the conformality of films formed by the low temperature oxidation of silicon structures. Cooling can be achieved by a variety of methods.

Figure 3:
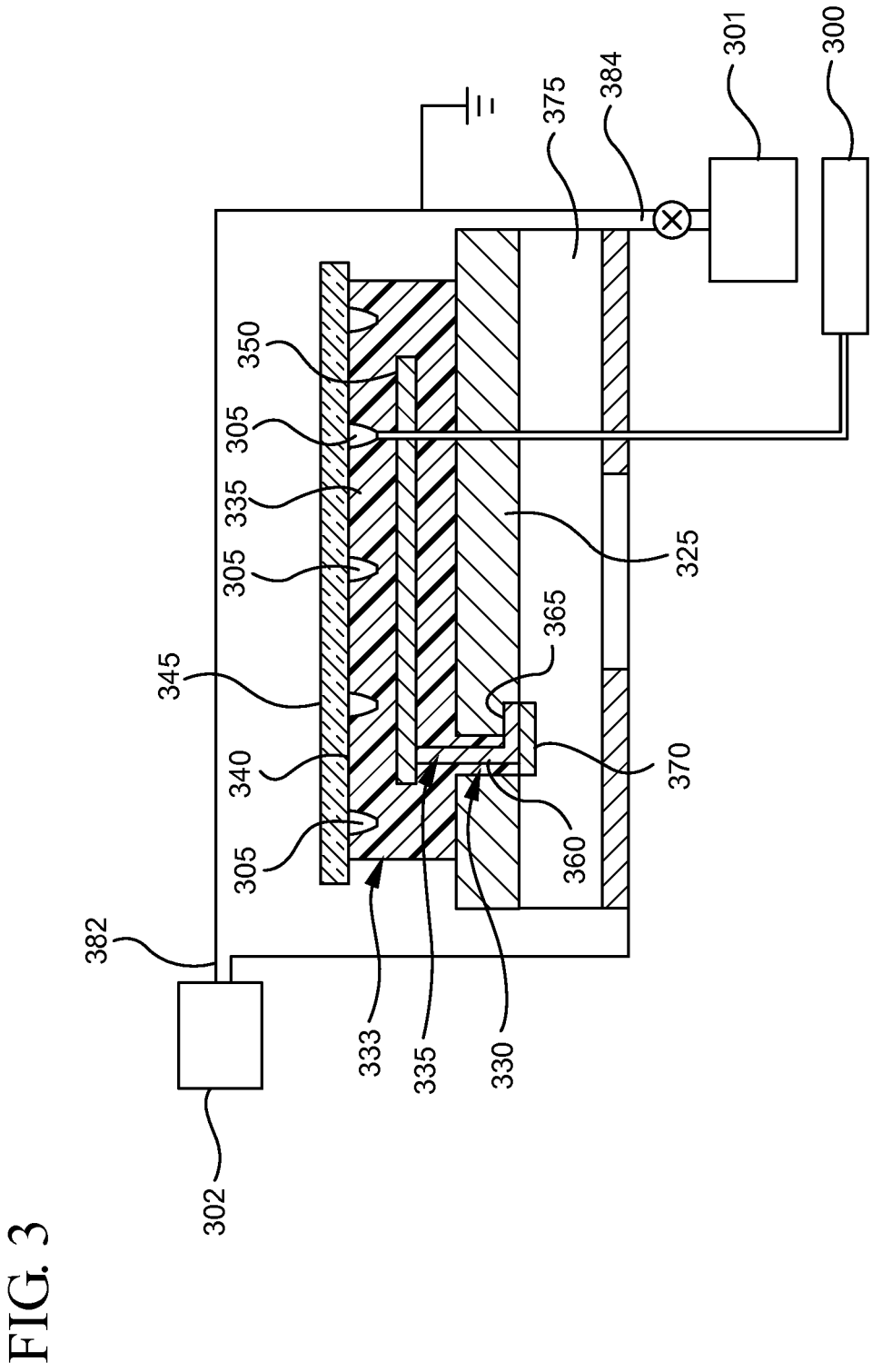
FIG. 3 illustrates an electrostatic chuck utilized in one embodiment of the invention.

According to a first embodiment, the support pedestal 26 may comprise an electrostatic chuck (ESC) that cools or contacts the backside of the substrate, or the side of the substrate in contact with the support pedestal 26, with a cooling gas to maintain the substrate temperature during low temperature oxidation. An exemplary embodiment of an ESC 325 is shown in FIG. 3. With reference to the reactor 11 of FIG. 1, the ESC 325 supports a semiconductor substrate 27 in the chamber 10. The ESC 325 may include a base with a bore 330 therethrough. In the embodiment shown, an electrostatic member 333 includes an insulator 335 which encloses an electrode 350. The electrostatic member 333 includes an upper surface 340 for receiving and supporting a substrate. An electrical connector 355 with a voltage supply lead 360 is electrically connected to the electrode 350. The voltage supply lead 360 extends through the bore 330 of the base of the ESC 325 and ends in an electrical contact 365 which electrically engages a voltage supply terminal 370. During use, the electrostatic chuck 325 is secured to a support 375 in a process chamber 380. It will be understood that the ESC 325 may be used with the reactor 11 shown in FIG. 1. In the embodiment shown in FIG. 3, the process chamber 380 (which corresponds to the chamber 10 of FIG. 1) may include a process gas inlet 382 (which corresponds to the gas injection system 28 in FIG. 1) connecting a process gas source 302 (which corresponds to the oxygen container 32, the hydrogen container 62 or the noble gas container 70 of FIG. 1) to the chamber 380. The process chamber 380 of FIG. 3 further includes an exhaust outlet 384 connected to an exhaust system 301.

In the embodiment of FIG. 3, a substrate 345 is held on the ESC 325 and a coolant is supplied from the coolant source or chiller 300 to cooling conduits 305, which also include cooling conduits or grooves, in the upper surface 340 of the insulator 335. In one or more embodiments, the coolant includes a conductive gas such as helium, argon and most inert elements in Group 8 of periodic table. The substrate 345 held on the ESC 325 covers up and seals the cooling conduits 305, preventing the coolant from leaking out. The coolant in the cooling conduits 305 removes heat from the substrate 345 and maintains the substrate 345 at constant temperatures during processing.

In one or more embodiments, the cooling conduits 305 are connected to the coolant source 300 by a series of channels, which can extend through the entire insulator and electrode. The cooling conduits 305 can be spaced apart, sized and distributed so that the coolant held therein can cool substantially the entire substrate 345.

In one or more embodiments, plasma pulsing techniques can be used to minimize substrate heating due to the plasma power transferred to the substrate. According to these embodiments, plasma pulsing techniques can be used to maintain the substrate at temperatures in the range of about −50° C. to 100° C., for example in a specific range of about −25° C. to 75° C., and more specifically in the range of about 0° C. to 50° C. during plasma oxidation.

Plasma pulsing can be achieved in a variety of suitable ways. In one embodiment, the plasma can be cycled on and off to maintain the substrate in the temperature ranges described herein. In another embodiment, the plasma can be pulsed plasmas in the kHz frequency in the range from about 2 kHz to about 50 kHz.

Embodiments utilizing the plasma pulsing technique of cycling the plasma on and off include modifying the average plasma electron temperature and chemistry by pulsing or time-modulating the RF plasma source power signal. This technique is also known as RF plasma source power modulating and controls electron temperature independently of the RF plasma source power level because electron temperatures decrease at a much quicker rate than plasma density during the power off time between pulsing. RF plasma source power modulating includes physically turning the plasma generation one and off sequentially or pursuant to a predetermined order. In one or more embodiments, RF plasma source power modulating includes turning the power source which generates the ion generating region and the plasma on and off.

According to one or more embodiments, the plasma pulsing technique includes alternating the frequency of the RF power source between a first frequency and a second frequency. In one or more embodiments, different quantities of power may also be supplied at the first and/or second frequencies. In one or more embodiments utilizing this plasma pulsing method to maintain or cool the substrate temperature to a temperature between −50° C. and 100° C. includes placing a substrate in a chamber of a plasma reactor and introducing a gas containing hydrogen, oxygen or a noble gas into the chamber. Power is thereafter supplied to the reactor at a first frequency to generate a first plasma in the chamber. Power is thereafter supplied at a second frequency to generate a second plasma in the chamber. Such embodiments may also supply power at frequencies which differ from both the first and second frequencies. In one or more embodiments, the amount of power supplied at the first or second frequencies can differ and can be increased or decreased cyclically or remain constant with respect to one or both of the frequencies. The rate of change in the amount of power supplied at the first or second frequency may also be controlled to regulate or reduce the temperature of the substrate.

In another embodiment, the substrate temperature may be maintained or cooled to between −50° C. and 100° C. via gas convection by flowing a cooling or convective gas into the reaction chamber. In one or more embodiments, a cooling gas may flow through the top of the substrate instead of backside of the substrate. In such embodiments, the chamber may be modified to allow another gas inlet for the cooling gas to flow into the chamber to cool the substrate. In one or more embodiments, the inlet may be positioned to allow the cooling gas to flow adjacent to the substrate surface. In one or more embodiments, the cooling gas is an inert gas which is supplied to the chamber from a cooling gas source. In one or more embodiments, the inert gas is a conductive gas such as helium, argon and other inert elements in Group 8 of periodic table.

Figure 4:
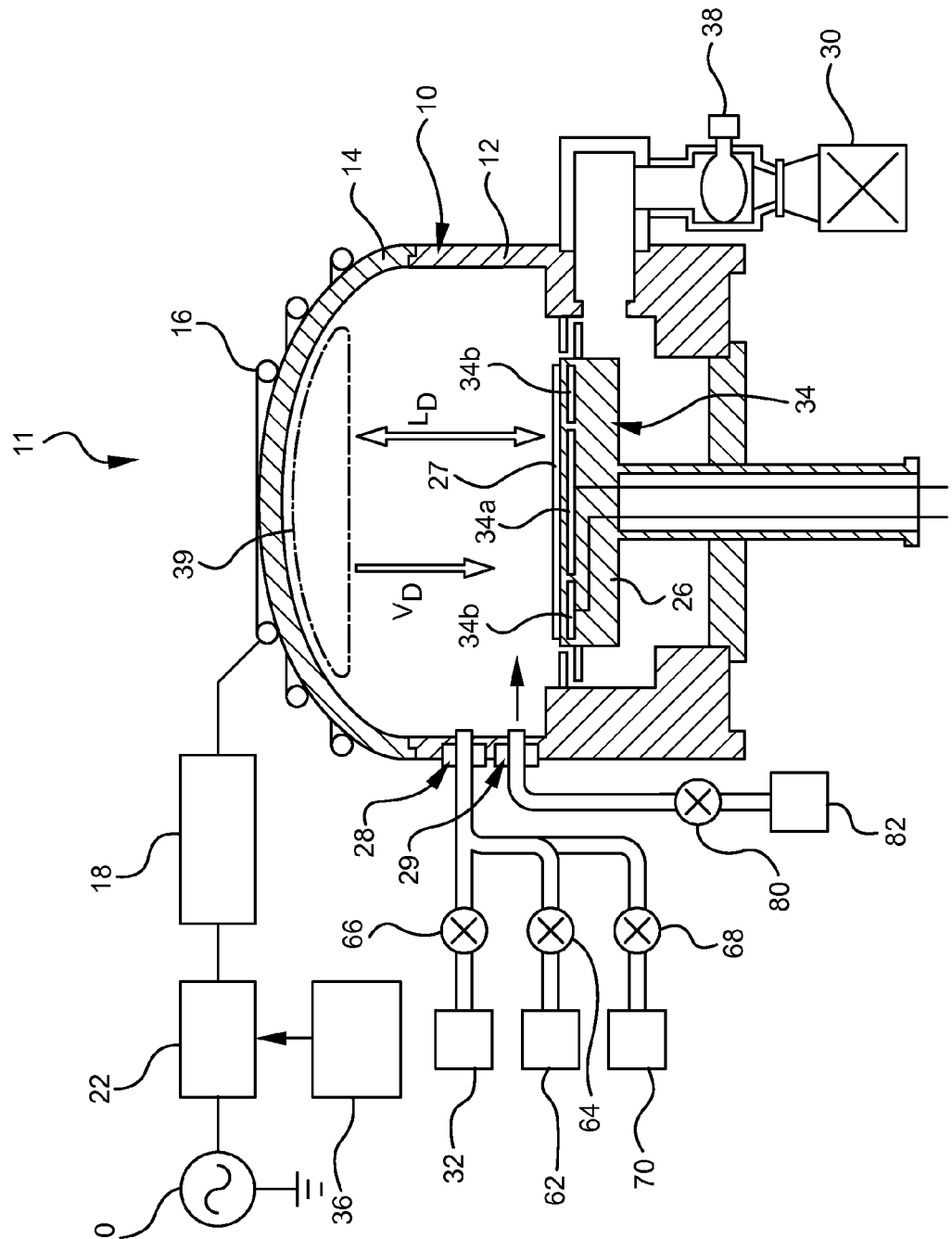
FIG. 4 illustrates a plasma reactor chamber which incorporates a convective gas source.

FIG. 4 depicts the reactor 11 of FIG. 1, further including a cooling gas delivery system 29 coupled to the interior of the chamber 10. The cooling gas delivery system 29 is supplied by a cooling gas source 82 and flows a cooling gas into the chamber 10. In one or more embodiments, the cooling gas source may include a helium container. In a specific embodiment, the cooling gas source may include a noble gas mixture container. Cooling flow control valve 80 is coupled to the cooling gas source 82. In the embodiment shown in FIG. 4, the cooling gas is supplied to the chamber and flows adjacent to the substrate in the direction shown, to cool the substrate temperature.

Figure 5:
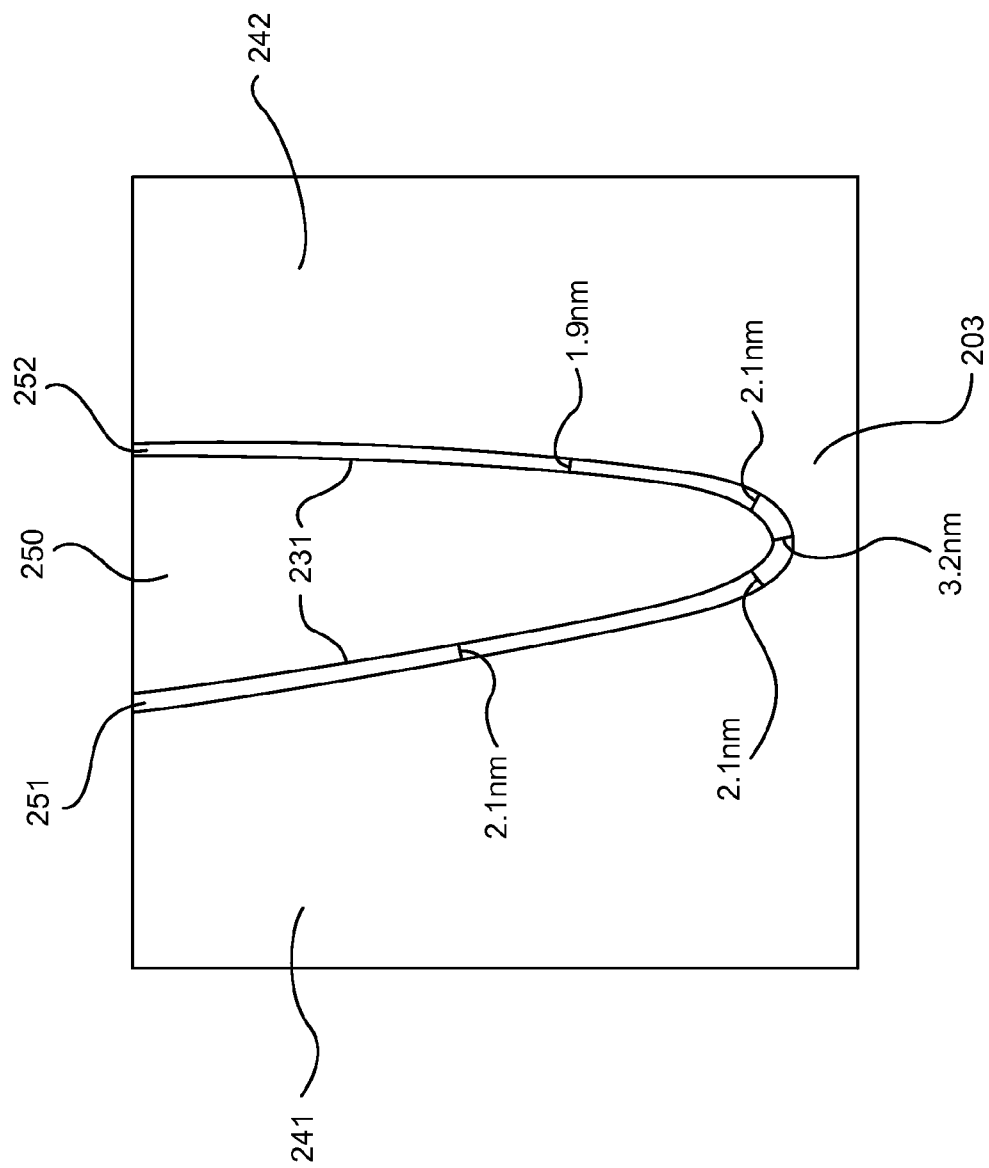
FIG. 5 illustrates an oxide layer formed by a plasma oxidation process of the prior art.

In accordance with one or more embodiments of the present invention, methods can be used to form oxide layers in a stack, for example, gate oxide stacks. FIG. 5 depicts a trench 250, as shown in FIGS. 2A-B, formed by the space between two gate stacks 241, 242 and a substrate 203. The gate stacks 241, 242 may be formed as described above with reference to FIGS. 2A-B and/or film stack 240. The substrate 203 may also comprise materials described herein with reference to FIGS. 2A-B. In FIG. 5, an oxide layer 231 is formed over the gate stacks 241, 242 and the trench 250 on substrate 203. The oxide layer is formed in a plasma reactor, such as the reactor 11 described with respect to FIG. 1, using conventional processing techniques that do not involve cooling the substrate.

Applicants have determined that by maintaining the substrate in the range of about −50° C. to 100° C. can improve conformality of the films or oxide layers formed by low temperature oxidation. In one or more embodiments, conformality can be improved such that the ratio between the thickness of the silicon dioxide layer on the sidewalls and the trench is above at least 75%.

FIG. 5 shows an oxide layer 231 formed by a plasma oxidation process according to the prior art. FIG. 5 specifically shows the bottom trench of a shallow trench isolation or "STI" structure with gate length of 65 nm and spacing of 65 nm. The oxide layer 231 of FIG. 5 is deposited in a trench 250 formed between two film stacks, such as the film stack 240 shown in FIG. 2B. The trench 250 is defined by two sidewalls 251, 252. Semiconductor structures 200 typically include multiple film stacks such as the one shown in FIG. 2B with trenches 250 between the film stack. The oxide layer 431 formed in the trench 250 of FIG. 5 has a greater thickness at the bottom of the trench 250 than at the sidewalls 251, 252. The silicon structure of FIG. 5 was formed by growing tunnel oxide having a thickness of 75 Angstroms using rapid thermal oxidation, followed by growing a doped polysilicon layer having a thickness of 1200 Angstroms. A high temperature oxide or "HTO" layer having a thickness of 50 Angstroms HTO and finally a SiN layer having a thickness of 400 Angstroms are formed on the polycrystalline layer using low-pressure chemical vapor deposition or "LPCVD" process. The height of the resulting structure is around 340-380 nm. The gate length and spacing is 65 nm.

The oxide layer 231 has a thickness of between 1.9 nm and 2.1 nm at the sidewalls 241, 242. The oxide layer 231 formed on the substrate 203 at the bottom surface of the trench 250 has a thickness of approximately 3.2 nm. The conformality of the oxide layer 231, namely the ratio between the oxide layer 231 thickness at the sidewalls 251, 252 to the thickness on the substrate 203 is in the range from about 0.59 to 0.66.

Figure 6A:
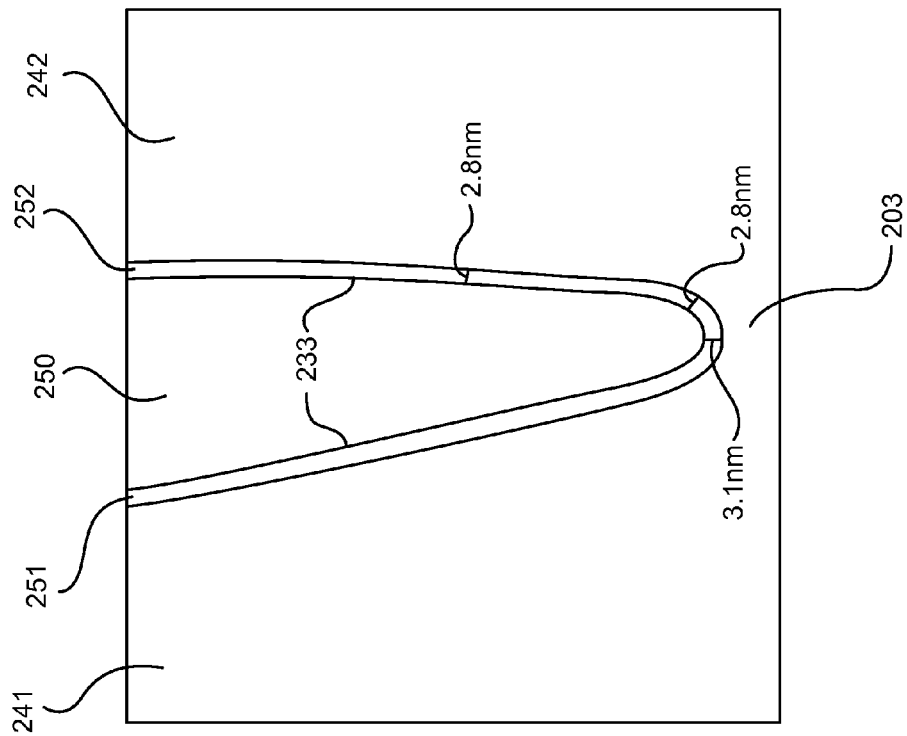
FIGS. 6A-6B illustrate oxide layers formed by plasma oxidation processes according to one or more embodiments of the present invention.

FIG. 6A shows an oxide layer 232 formed on the same type of substrate and structure utilized in FIG. 5, however, the method of forming the oxide layer 232 includes cooling or maintaining the substrate 203 temperature by utilizing an ESC, as described herein. The substrate 203 was placed on an ESC in a chamber, as described otherwise in this application, and the backside of the substrate 203 or the side of the substrate in contact with the ESC was cooled using helium gas during a plasma oxidation process. In the embodiment shown in FIG. 6A, the oxide layer 251 was formed by room temperature plasma oxidation process utilizing a source power of about 2000 W and a process gas comprising 80% $H_2$ and having a total flow rate of 200 sccm. The He cooling gas utilized in the ESC was set at a time of 4t and the substrate was cooled to a temperature in the range from about 30° C. to about 50° C.

The resulting oxide layer 232 has a thickness at the sidewalls 251, 252 of between 2.5 nm and 2.7 nm. The oxide layer 232 has a thickness at the bottom surface of the trench 250 of 2.7 nm. The conformality of the oxide layer 232 is between 0.93 and 1.0.

Figure 6B:
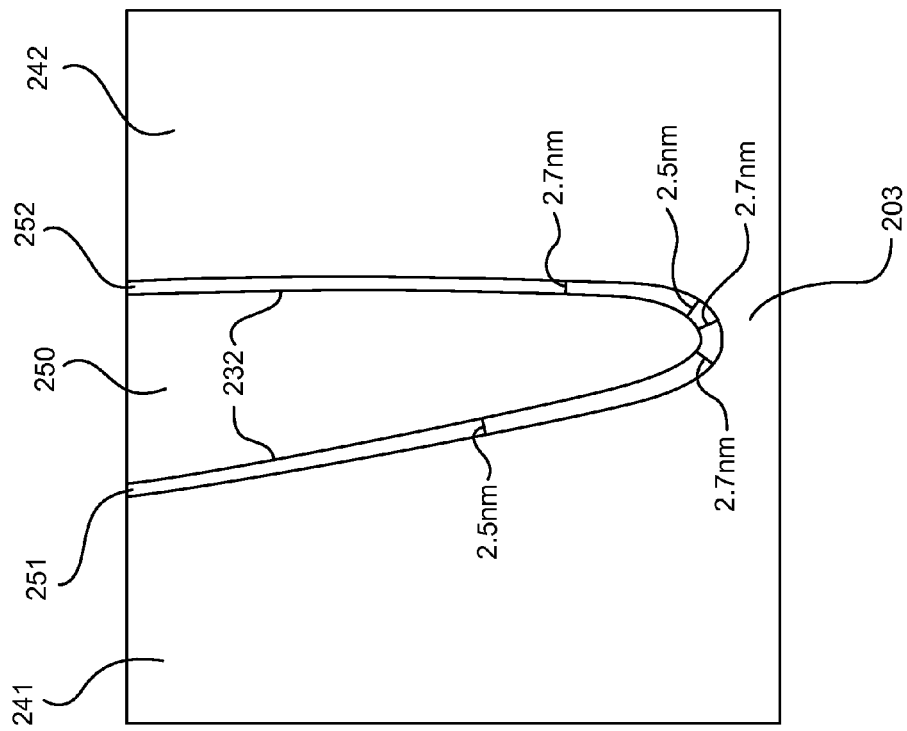

Referring to FIG. 6B, an oxide layer 233 was formed on same type of substrate and structure used in FIG. 5 using a plasma pulsing method described herein to maintain or cool the substrate temperature. As otherwise described herein, RF plasma source power signal was pulsed by cycling the power supplied to the reactor. A macro-pulsing process was used to physically turn the plasma power ON and OFF according to the following recipe: ON 4 times for 25 seconds and OFF 4 times for 120 seconds. An RT decoupled plasma oxidation or "DPO" chamber utilizing a power source of 2000 W was used to form the oxide layer. The process gas used to form the oxide layer included 80% $H_2$ and was flowed into the chamber at a flow rate of about 200 sccm. The substrate temperature was cooled to a temperature in the range from about 20° C. and about −30° C.

The resulting oxide layer 233 has a thickness at the sidewalls 251, 252 of 2.8 nm. The thickness of the oxide layer 233 at the bottom surface of the trench 250 is 3.1 nm, resulting in a conformality of 0.90. As is evident from the above results, it is found that maintaining or cooling the substrate temperature during plasma oxidation to a temperature in the range of about −50° C. and 100° C. results in a conformal oxide layer.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of treating an oxide layer on a semiconductor substrate, comprising: placing a substrate to be oxidized on a substrate support in a plasma reaction chamber having an ion generation region; introducing a process gas into the chamber; and generating a plasma in the ion generation region of the plasma reaction chamber to form an oxide layer on the substrate, the ion generation region being elevated a distance greater than about 2 cm above the substrate, the oxide layer having a horizontal surface thickness and a sidewall thickness, while actively cooling the substrate at a temperature in the range of about −50° C. to 100° C.

2. A method of forming an oxide layer on a semiconductor substrate, comprising: placing a substrate to be oxidized on a substrate support in a chamber of a plasma reactor, the chamber having an ion generation region; introducing a process gas into chamber; and generating a plasma in the ion generation region of the chamber, where the ion generation region of the chamber is elevated a distance greater than about 2 cm from the substrate, to form an oxide layer on the substrate while actively cooling the substrate to a temperature below about 100° C., the ion generation region being elevated a distance above the substrate.

3. The method of claim 1, wherein the substrate temperature is actively cooled to a temperature in the range of about 0° C. to 50° C. during formation of the oxide layer.

4. The method of claim 1, wherein actively cooling the substrate temperature comprises flowing a coolant through the substrate support.

5. The method of claim 4, wherein the substrate support comprises a surface with a plurality of cooling conduits and actively cooling the substrate temperature comprises contacting the substrate with the surface of the substrate support.

6. The method of claim 5, wherein the substrate support further comprises a series of channels which supply a coolant to the cooling conduits.

7. The method of claim 4, wherein actively cooling the substrate temperature comprises flowing a convective gas into the reaction chamber.

8. The method of claim 7, wherein the convective gas comprises helium.

9. The method of claim 7, wherein the convective gas comprises a flow rate in the range of about 500 sccm to about 3000 sccm.

10. A method of forming an oxide layer on a semiconductor substrate, comprising:

placing a substrate to be oxidized on a substrate support in a chamber of a plasma reactor, the chamber having an ion generation region;

introducing a process gas into chamber; and generating a plasma in the ion generation region of the chamber greater than about 2 cm from the substrate to form an oxide layer on the substrate while actively cooling the substrate to a temperature below about 100° C., the ion generation region being elevated a distance above the substrate.

11. The method of claim 10, wherein the plasma comprises an oxygen species and actively cooling the substrate increases the sticking coefficient of the oxygen species.

12. The method of claim 10, wherein actively cooling the substrate comprises flowing a convective gas to the reactor.

13. The method of claim 10, wherein actively cooling the substrate comprises circulating a coolant between the substrate and the substrate support.

14. The method of claim 13, wherein the coolant comprises helium.

15. The method of claim 14, wherein the coolant further comprises a second noble gas.

* * * * *